US012592574B2

(12) United States Patent
Kroener et al.

(10) Patent No.: US 12,592,574 B2
(45) Date of Patent: Mar. 31, 2026

(54) METHOD AND APPARATUS FOR EXECUTING A CHARGING OPERATION OF A DEVICE BATTERY

(71) Applicant: Robert Bosch GmbH, Stuttgart (DE)

(72) Inventors: Christoph Kroener, Freiberg am Neckar (DE); Christoph Woll, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 770 days.

(21) Appl. No.: 17/963,357

(22) Filed: Oct. 11, 2022

(65) Prior Publication Data

US 2023/0231396 A1     Jul. 20, 2023

(30) Foreign Application Priority Data

Oct. 11, 2021    (DE) ..................... 10 2021 211 419.9

(51) Int. Cl.
H02J 7/84          (2026.01)
B60L 53/62         (2019.01)
(Continued)

(52) U.S. Cl.
CPC ................ H02J 7/84 (2026.01); B60L 53/62 (2019.02); B60L 53/66 (2019.02); B60L 58/16 (2019.02);
(Continued)

(58) Field of Classification Search
CPC .......... H02J 7/005; H02J 7/0013; H02J 7/007; H02J 7/00714; H02J 7/007188;
(Continued)

(56) References Cited

U.S. PATENT DOCUMENTS

| | | | | |
|---|---|---|---|---|
| 2010/0198536 A1* | 8/2010 | Hess | .................... | G01R 31/392 |
| | | | | 702/63 |
| 2017/0214253 A1* | 7/2017 | Kim | .................. | H02J 7/0018 |
| 2020/0369171 A1* | 11/2020 | Schweitzer | ......... | H02J 7/00034 |

FOREIGN PATENT DOCUMENTS

| | | |
|---|---|---|
| DE | 102015001050 A1 | 8/2016 |
| DE | 102018203824 A1 | 9/2019 |

(Continued)

*Primary Examiner* — Julian D Huffman
*Assistant Examiner* — Nathan J Instone
(74) *Attorney, Agent, or Firm* — Michael Best & Friedrich LLP

(57)          ABSTRACT

A method for determining charging profiles for device batteries of battery-operated devices. In one instance, the method includes selecting device batteries having the same usage-related load and the same aging state; dividing the selected device batteries into groups; assigning different charging profiles to the groups of device batteries, wherein the charging profiles indicate for a charging operation a maximum permissible charging current depending on a charge level range; operating the device batteries of all groups with the respectively assigned charging profiles for a predetermined period of time, so that charging operations are executed depending on the respectively assigned charging profile; detecting a change in the average aging state for each group of device batteries between the beginning of the predetermined time period and the end of the predetermined time period; and adjusting the charging profile depending on the change in the average aging state.

10 Claims, 6 Drawing Sheets

(51) Int. Cl.

| | |
|---|---|
| *B60L 53/66* | (2019.01) |
| *B60L 58/10* | (2019.01) |
| *B60L 58/16* | (2019.01) |
| *G01R 31/367* | (2019.01) |
| *G01R 31/392* | (2019.01) |
| *H01M 10/44* | (2006.01) |
| *H02J 7/50* | (2026.01) |
| *H02J 7/90* | (2026.01) |
| *H02J 7/94* | (2026.01) |

(52) U.S. Cl.
CPC ......... *G01R 31/367* (2019.01); *G01R 31/392* (2019.01); *H01M 10/441* (2013.01); *H02J 7/50* (2026.01); *B60L 58/10* (2019.02); *H01M 10/44* (2013.01); *H01M 2220/20* (2013.01); *H02J 7/90* (2026.01); *H02J 7/94* (2026.01)

(58) Field of Classification Search
CPC ...... H02J 7/0047; H02J 7/0048; H02J 7/0014; H02J 7/0018; B60L 53/62; B60L 53/66; B60L 58/10; B60L 58/16; G01R 31/367; G01R 31/392; H01M 10/441; H01M 10/44; H01M 2220/20; H01M 10/446
USPC ......................................................... 320/107
See application file for complete search history.

(56) References Cited

FOREIGN PATENT DOCUMENTS

| | | |
|---|---|---|
| DE | 102019216943 A1 | 5/2020 |
| DE | 102020203199 A1 | 4/2021 |
| EP | 2162752 B1 | 11/2019 |

* cited by examiner

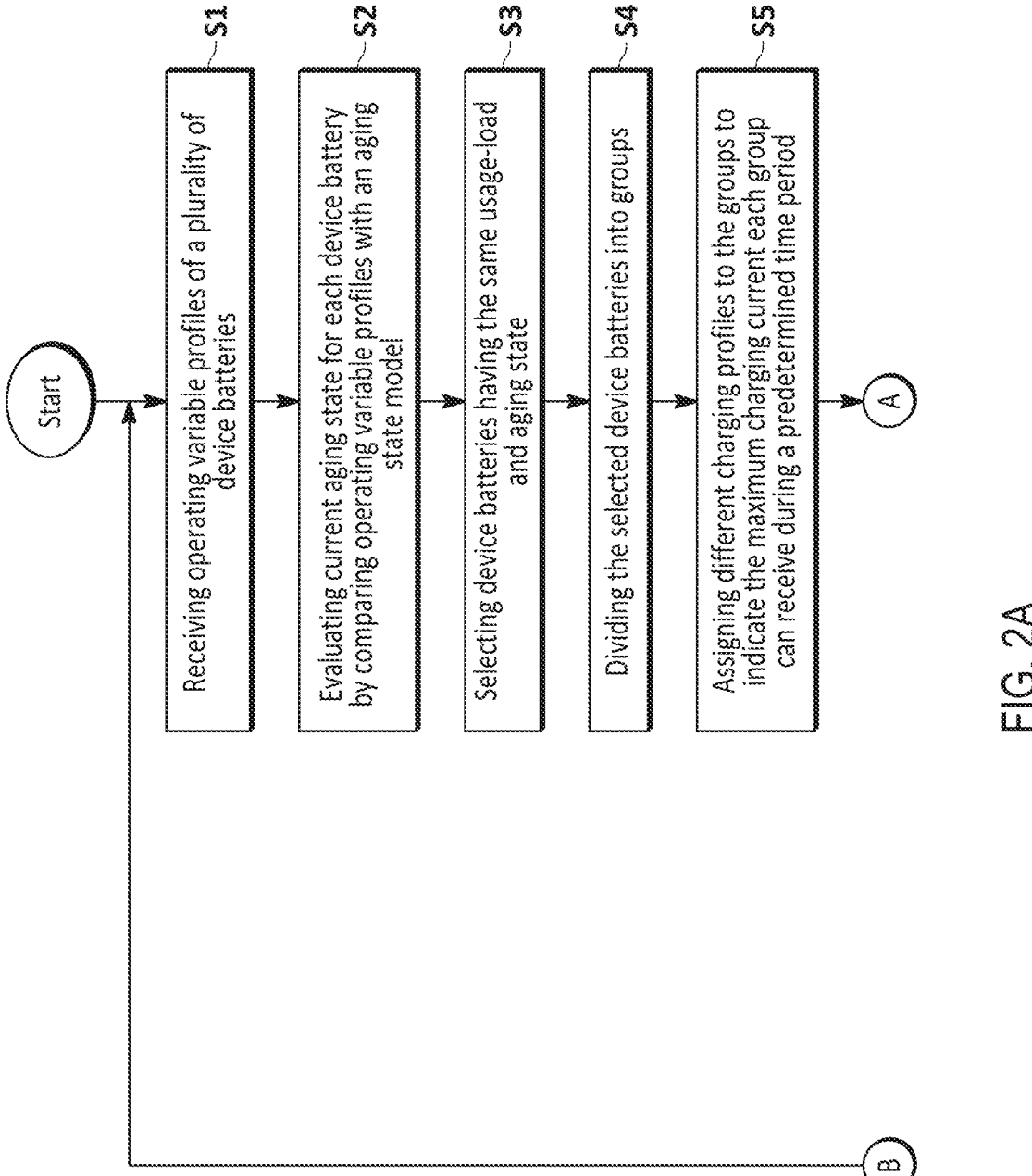

Start

S1 — Receiving operating variable profiles of a plurality of device batteries

S2 — Evaluating current aging state for each device battery by comparing operating variable profiles with an aging state model S3 — Selecting device batteries having the same usage-load and aging state S4 — Dividing the selected device batteries into groups S5 — Assigning different charging profiles to the groups to indicate the maximum charging current each group can receive during a predetermined time period

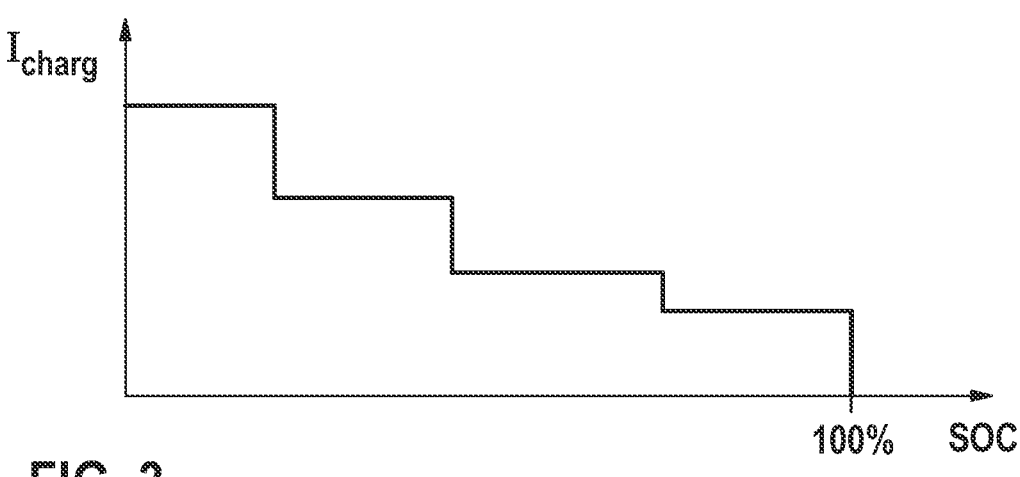
FIG. 3
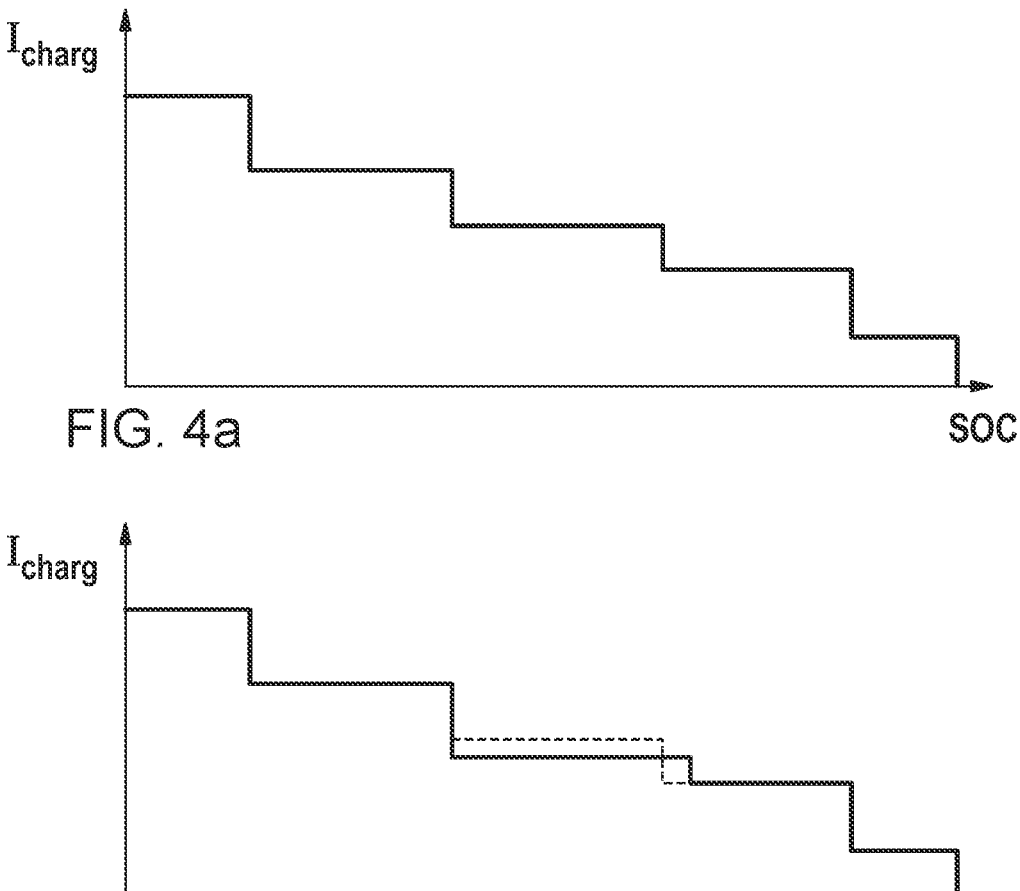
FIG. 4a
FIG. 4b

METHOD AND APPARATUS FOR EXECUTING A CHARGING OPERATION OF A DEVICE BATTERY

BACKGROUND OF THE INVENTION

The invention relates to device batteries, in particular vehicle batteries of electrically powered vehicles, and in particular to adjusting a charging strategy for such device batteries.

Charging and discharging a device battery leads to degradation. The degree of degradation depends on parameters of the charging and discharging. While degradation by a discharge process is largely determined by the usage of the device battery, the stress applied to the device battery during an automated charging operation is determined by parameters that specify the manner in which the charging operation is performed. The parameters of the charging operation thereby determine the aging behavior of the device battery.

The charging of the device battery is generally performed on the basis of a predetermined charging profile. The charging profile is generally given by a characteristic curve which determines a dependence of a charging current or of a maximum charging current on a charge level. The charging profile is defined such that it optimizes the charging duration, the maximum charging current and the accepted aging behavior, so that a compromise between the load on the device battery and the required charging time can be achieved.

A charging profile for a device battery is normally determined before the start of production on the basis of extensive laboratory measurements, wherein the charging profile is created in such a way that the dependence of degradation on the charging current, the battery temperature and the charge level of the device battery can be taken into account.

Since each user behavior puts different loads on the device battery, the aging state is not determined solely by aging according to the calendar, but also by the cyclical loading due to profiles of the charging and discharging currents, of the charge level and also of the battery temperature. However, since only one charging profile for a specific device battery type is currently available for normal charging and fast charging, the influence of the charging operation on the aging behavior of the device battery cannot be taken into account.

SUMMARY OF THE INVENTION

According to the invention, a method for adjusting a charging profile to an individual usage of a device battery, and an apparatus according to the additional independent claim are provided.

Further embodiments are specified in the dependent claims.

According to a first aspect, a method for determining charging profiles for device batteries of battery-operated devices is provided, wherein the charging profiles determine the execution of respective charging operations of the device batteries, the method having the following steps:

selecting device batteries with the same usage-related load and the same aging state;

dividing the selected device batteries into groups;

assigning different charging profiles to the groups of device batteries, wherein the charging profiles indicate for a charging operation a maximum permissible charging current depending on a charge level range;

operating the device batteries of all groups with the respectively assigned charging profiles for a predetermined period of time, so that charging operations are executed depending on the respectively assigned charging profile;

detecting a change in the average aging state (aging state difference) for each group of device batteries between the beginning of the predetermined time period and the end of the predetermined time period;

adjusting the charging profile of at least one of the groups of the device batteries depending on the change in the average aging state in order to reduce the load on the device batteries of the at least one group.

For charging the energy store in electrical vehicles, the charging strategy is of the utmost importance, since it determines the duration of charging and the charging current and thus the aging behavior (SoH, state of health) of the energy store. The charging profile is nowadays matched to the cell chemistry such that optimal charging is possible. What optimal means here is that the duration of charging, charging current and aging behavior are matched to one another in the best possible manner.

Before a device battery is used, it is extensively tested in order to determine an average service life under defined load conditions. This results in warranty conditions which define a change in the aging state by a predetermined amount during a predetermined period of use. For example, warranty conditions can stipulate that the device battery in eight years does not fall below an SOH-C value of the aging state of 80% or is able to complete a mileage of 300,000 km when used in an electric vehicle. The charging profile for conventional device batteries is generally specified by the manufacturer and represents an average load on the device battery, by means of which compliance with the warranty conditions can be achieved in addition to other operating conditions.

However, aging of a device battery significantly depends on its load due to the type of usage, such as the level of charging and discharging currents, high temperatures, many fast charging cycles and the like. Compliance with the warranty conditions thus depends on the type of usage of the device battery and so the aim is to influence the load on the device battery during usage in such a way that the warranty conditions are complied with. The load during a charging operation represents a significant influence on the aging behavior of the device battery.

In the method described above, the load on the device battery is reduced by adjusting a predetermined charging profile. Accordingly, for device batteries, one or more charging profiles are fixed which are selected according to requirements, such as normal charging or fast charging. The selected charging profile is customarily applied to all device batteries of the same type during a charging operation.

A typical charging profile has a stepped profile of a maximum charging current depending on the charge level, i.e., the filling of the device battery in relation to total storage capacity. Such a charging profile limits the maximum charging current and thereby prevents excessive stress on the device battery.

By reducing the load on the device battery by adjusting a predetermined charging profile for an individual device battery, it is possible to directly influence the further course of aging of the device battery in question. An adjustment of the charging profile can reduce the stress by further reducing maximum charging currents.

The influence of different charging profiles on the aging behavior of selected device batteries is determined according to the above method. For this purpose, the device batteries are selected according to one or more load variables, in particular with the aid of a clustering method. The selection is made in such a way that a similar load results for the device batteries of the selection and that these have a similar aging state (i.e., an aging state within predetermined tolerance limits).

The aging state (SOH: state of health) is the key variable for indicating a remaining battery capacity or remaining battery charge, i.e., for the remaining maximum charge range of a fully discharged and of a fully charged battery. The aging state represents a measure of the aging of the device battery or of a battery module or of a battery cell and can be indicated as the capacity retention rate (SOH-C). The capacity retention rate SOH-C can be expressed as a ratio between the measured instantaneous capacity and an initial capacity of the fully charged battery. Alternatively, the aging state can be defined as an increase in internal resistance (SOH-R). The relative change in internal resistance SOH-R increases with increasing aging of the device battery.

The selected device batteries are divided into two, three or more than three groups, and different charging profiles for executing charging operations are assigned to the groups. After a predetermined period of time has elapsed, an aging state is determined in each case and the change in the aging state during the predetermined time period is determined therefrom. The charging profile is adjusted accordingly to the group of device batteries for which there is the greatest change in the aging state, in order to achieve a lighter load during the charging operations of the device batteries in question.

In particular, the method can iteratively adjust the charging profile of the at least one group for predetermined time durations in each case, until all changes in the average aging states for each group of device batteries are less than a predetermined difference threshold value.

The method is thus executed cyclically so that the aging behavior of the device batteries of the groups, i.e. the increase in aging as the difference between an average aging state of the device batteries of the group in question at the beginning of the predetermined time period and the average aging state of the device batteries of the group in question after the predetermined time period, converges and is increasingly reduced.

If a termination condition is met, such as that the increase in aging within the predetermined time period does not exceed a predetermined threshold value, the charging profile that caused the smallest change in the aging state during the last iteration will be assigned to the selected device batteries.

It can be provided that the selection of device batteries with the same usage-related load is determined on the basis of operating variable profiles from which one or more operating characteristics are generated, which include, in particular, electrochemical state characteristics, accumulated characteristics and/or statistical variables, determined over the entire service life to date, of operating variables.

The selection can be performed on the basis of histogram data using a clustering method.

By selecting identically loaded device batteries, it is possible to determine the influences of the charging profile on aging behavior by making comparisons within the multiple groups of device batteries. The division of the identically loaded device batteries into groups can take place, for example, into a constant number of groups or, depending on the number of selected identically loaded device batteries, into groups with a predetermined number of device batteries in each case.

It can be provided that the charging profile has a stepped profile which in each case assigns an in particular constant maximum permissible charging current to a charge level range.

Furthermore, the adjustment of the charging profile can be carried out by reducing or increasing the maximum permissible charging current within a charge level range and/or by extending or shortening the duration of the charge level range in favor of a charge level range with a lower or higher maximum permissible charging current.

In particular, the adjustment of the charging profile can be carried out within the charge level range which is most frequently run through during charging operations of the selected device batteries.

The adjustment of the charging profiles can thus take place in various ways. In particular, the charging profile can have a stepped profile. In this case, charge level ranges are each assigned a generally constant maximum permissible charging current. With increasing charge levels of the charging profile, the maximum permissible charging current decreases. The profile can be changed by reducing a maximum permissible charging current during a specific charge level range or by adjusting the extent of a charge level range with a predetermined maximum permissible charging current. The adjustment preferably takes place in such a way that the charging duration remains unchanged, which is achieved in particular by the area under the charging profile curve remaining constant when the charging profile is adjusted. In the case of a stepped profile of the charging profile, the duration of a charge level range can thus be shortened and at the same time the level of the maximum permissible charging current of the same or of a further charge level range can be increased such that the charging duration remains unchanged, and vice versa.

Furthermore, the charging profile can be adjusted as a function of a correction variable obtained from a look-up table.

Furthermore, operating variable profiles of a plurality of device batteries can be transmitted to a central unit external to the device, wherein the method is executed in the central unit for each of the device batteries and the adjusted charging profiles are transmitted to the device batteries in question.

According to one embodiment, the method can be executed in a device-external central unit for each of the device batteries and the adjusted charging profiles can be transmitted to the device batteries concerned.

According to a further aspect, an apparatus for executing the above method is provided.

BRIEF DESCRIPTION OF THE DRAWINGS

Embodiments are explained in more detail below with reference to the accompanying drawings. In the drawings:

FIGS. 2A and 2B show a flow chart illustrating a method for determining a charging profile for vehicles of a certain aging state and load state;

FIG. 3 shows a representation of an exemplary charging profile;

FIGS. 4a and 4b show an exemplary representation of a change in the charging profile by reducing the maximum permissible charging current and shortening the size of the relevant charge level range;

DETAILED DESCRIPTION

The method according to the invention is described below on the basis of vehicle batteries as device batteries in a multiplicity of motor vehicles as devices of the same type. The method can be operated in a central unit and used for determining individual charging profiles for the vehicle batteries.

The example described herein is representative of a plurality of stationary or mobile devices with a network-independent power supply, such as vehicles (electric vehicles, pedal electric cycles etc.), installations, machine tools, domestic appliances, IoT devices and the like, which are connected to a device-external central unit (cloud) via a corresponding communication link (e.g., LAN, Internet).

Figure 1:
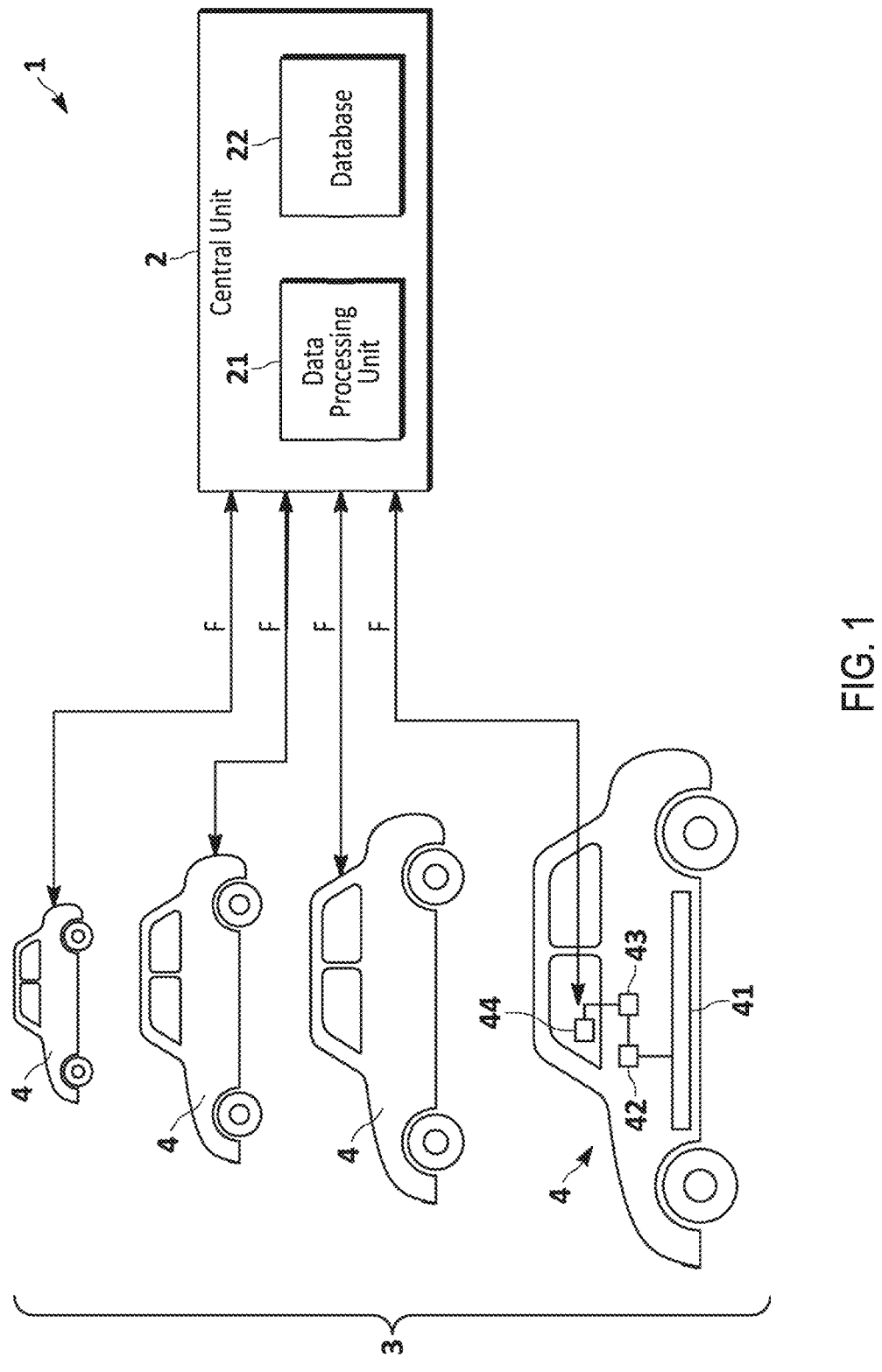
FIG. 1 shows a schematic representation of a system for providing, in a central unit, driver- and vehicle-specific operating variables for the vehicle-external individual determination of charging profiles for a vehicle battery.

FIG. 1 shows a system 1 for collecting fleet data in a central unit 2 for generating and operating as well as for evaluating a charge profile determination model and an aging state model. The aging state model is used to determine an aging state of an electrical energy store, such as a vehicle battery in a motor vehicle, and to predict the aging state or an aging state profile. FIG. 1 shows a vehicle fleet 3 with multiple motor vehicles 4. The charge profile determination model comprises an algorithm according to the method described below.

One of the motor vehicles 4 is shown in more detail in FIG. 1. The motor vehicles 4 each have a vehicle battery 41 as a rechargeable electrical energy store, an electric drive motor 42 and a control unit 43. The control unit 43 is connected to a communication module 44 which is suitable for transmitting data between the respective motor vehicle 4 and a central unit 2 (a so-called cloud).

The motor vehicles 4 send to the central unit 2 the operating variables F which specify at least variables which influence the aging state of the vehicle battery 41. In the case of a vehicle battery, the operating variables F can be time series of a battery current, of a battery voltage, of a battery temperature and of a charge level (SOC: state of charge), both at the pack, module and/or cell level. The operating variables F are captured in a fast time frame of 1 Hz to 100 Hz and can be regularly transmitted to the central unit 2 in uncompressed and/or compressed form.

Furthermore, by utilizing compression algorithms for the purpose of minimizing the data traffic to the central unit 2 the time series can be transmitted to the central unit 2 in blocks at intervals of several hours to several days.

The central unit 2 has a data processing unit 21 in which the method described below can be executed, and a database 22 for storing data points, model parameters, states and the like.

An aging state model that can be data-based can be implemented in the central unit 2. The aging state model can be used regularly, i.e., for example, after the expiration of the respective evaluation period, in order to determine the current aging state of the vehicle battery 41 in question on the basis of the time profiles of the operating variables (in each case since the respective vehicle battery was put into operation).

For the time series, compression algorithms can be used for transmission for the purpose of minimizing data traffic to the central unit 2. Furthermore, event-based transmission can take place so that data transfer is triggered and occurs when, for example, a stable or known WLAN network connection has been identified.

Figure 2B:
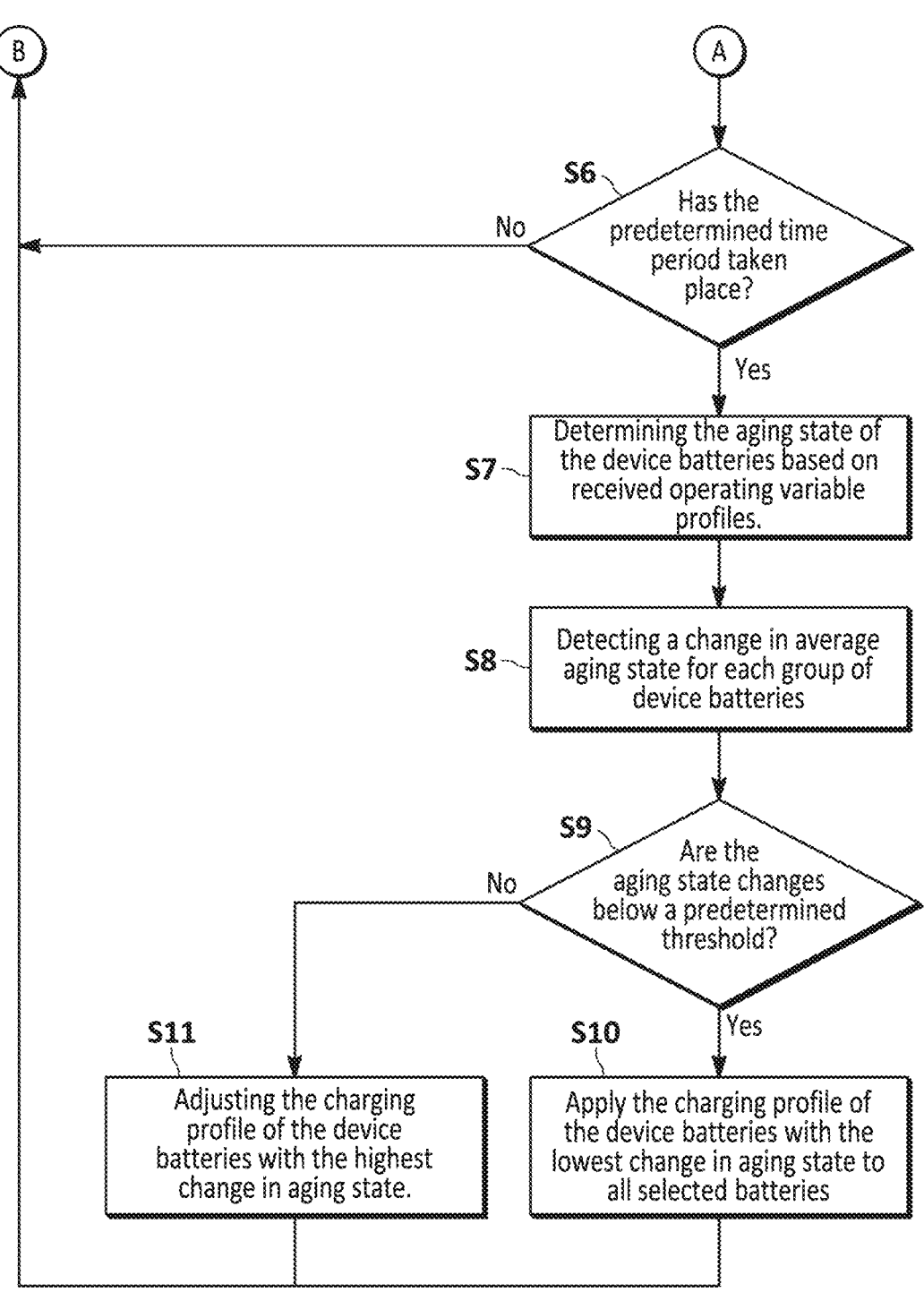

FIGS. 2A and 2B illustrate, using a flow chart, the method for determining a charging profile to be assigned to a vehicle battery 41 and for executing a charging operation on the basis of the associated charging profile. The method can be carried out in conjunction with the central unit 2.

The method for adjusting a charging profile for a vehicle battery 41 firstly provides in step S1 for the operating variable profiles of the plurality of vehicle batteries 41 to be received in the central unit 2. The operating variables can comprise, for example, a battery current, a battery voltage (terminal voltage), a charge level and/or a battery temperature, which can be provided as time-series data.

In step S2, the operating variable profiles are evaluated with the aid of an aging state model in order to provide a current aging state for each vehicle battery 41. The determination can be carried out in the central unit 2 or alternatively in each vehicle 4 on the basis of an aging state model implemented there.

The aging state model can be implemented, for example, in the central unit 2 and can be used regularly, i.e., for example, after expiration of an evaluation period of e.g. one week, in order to determine the current aging state of the relevant vehicle battery 41 of the associated vehicle fleet 3 on the basis of the temporal profiles of the operating variables (in each case since the respective vehicle battery was put into operation) and operating characteristics determined therefrom.

A physical aging model can generally be used to model an aging state for a device battery. The aging state of a battery can generally be determined, for example, on the basis of a physical aging model according to electrochemical model equations. The calculation of the physical aging model is based on a time integration method for solving a differential equation system by a numerical time integration method. The electrochemical model equations characterize electrochemical states of a nonlinear differential equation system. The electrochemical states are calculated continuously on the basis of temporal profiles of the operating variables and can be mapped onto the physical aging state, as SOH-C and/or as SOH-R. For this purpose, the operating variables, for example battery current, battery temperature, battery voltage and the like, must be present as high-resolution time series.

The aging state can alternatively be determined using an empirical basic model in the central unit 2, for example on the basis of analysis of the charging and/or discharging phases of battery utilization. An SOH-C estimate is preferably carried out by coulomb counting or by forming a current integral, which is divided by the range of the charge state between the beginning and the end of the relevant charging and/or discharging phase. Advantageously, calibration on the open-circuit voltage characteristic is carried out in idle phases in order to also calculate the charge level profile in the central unit 2. A meaningful indication of the aging state can be obtained, for example, when the device battery is brought from a completely discharged state into a fully charged state during a charging operation. Resistance-related aging states (SOH-R values) can also be calculated by voltage changes in relation to a current change. These are usually related to a defined time interval.

In step S3, the vehicle batteries 41 with the same usage behavior are selected from the operating variable profiles. The selection can be based on histogram data. For example, by means of a clustering method, vehicles or vehicle batteries can be identified which cover almost the same distances daily and recharge the battery again at almost the same charge levels. Alternatively, vehicles can thereby also be identified which, after completion of the charging operation, travel virtually the same distance and are then recharged and thus have so-called charge-to-charge behavior. In general, vehicles with the same usage behavior can thus be selected whose vehicle batteries are charged as required, in each case only for the respectively required distance and which after traveling the distance in question are charged to the same charge level. The selection of the vehicle batteries under consideration takes place on the basis of operating characteristics using conventional clustering methods.

For example, the vehicles can be classified according to distances covered per unit of time, such as for example per day, such as vehicles with travel distances up to 10 km/day, further vehicles with travel distances of 10-20 km/day, further vehicles with travel distances of 20-30 km/day, etc. The clusters for the selection can be formed from these histogram data (individual bars).

The operating characteristics can include, for example, electrochemical state characteristics, accumulated characteristics and/or statistical variables determined over the entire service life to date. In particular, the operating characteristics may, for example, include: Electrochemical states, such as SEI layer thickness, change in cyclable lithium due to anode/cathode side-reactions, fast absorption of electrolyte solvent, slow absorption of electrolyte solvents, lithium deposition, loss of active anode material and loss of active cathode material, internal resistances, histogram characteristics such as temperature against charge level, charging current against temperature and discharge current against temperature, in particular multidimensional histogram data regarding battery temperature distribution against charge level, charging current distribution against temperature and/or discharge current distribution against temperature, current throughput in ampere hours, accumulated total charge (Ah), an average capacity increase in a charging operation (in particular for charging operations in which the charge increase is above a threshold proportion (e.g. 20%) of total battery capacity), charging capacity and an extreme value (maximum) of the differential capacity dQ/dU, or accumulated mileage. These variables are preferably converted in such a way that they characterize the real usage behavior as well as possible. For example, in the accumulated charge throughput (Ah), a normalization with the SOH-R takes place, so that the poorer battery efficiency is correctly mapped in order to manage the same travel distance (in km). The operating characteristics M can be used in their totality or only in part for the method described here.

Further information can be derived from the operating characteristics and from the operating variables: a temporal load pattern such as charging and driving cycles, determined by usage patterns (such as, for example, fast charging at high current intensities or strong acceleration or braking processes with recuperation), a usage time of the vehicle battery 41, a charge accumulated over the service life and a discharge accumulated over the service life, a maximum charging current, a maximum discharging current, a charging frequency, an average charging current, an average discharging current, a power throughput during charging and discharging, an (in particular average) charging temperature, an (in particular average) spread of the charge level and the like. This temporal load pattern characterizes the typical temporal usage behavior.

If vehicle batteries 41 of comparable usage behavior are selected by the clustering method, in step S4 these will be divided, for example, by a random selection into at least two groups, preferably more than two groups or three groups, and different charging profiles are assigned on a group basis to the corresponding vehicle batteries 41 of the groups. For example, one of the groups can be assigned the charging profile specified by the manufacturer, and in each case a modified charging profile can be assigned to the one or more further groups. The different charging profiles can initially be derived from the charging profile specified by the manufacturer by simple adjustment, as described below.

The adjustment of a charging profile provides for a reduction in the load during a charging operation. The adjustment takes place in such a way that the charging time duration for a predetermined stepped charging profile, as shown for example in FIG. 3, is not extended. The stepped charging profile defines a stepped profile of a maximum permissible charging current $I_{charg}$ against the charge level SOC, wherein charge level ranges in each case are assigned a usually constant maximum permissible charging current $I_{charg}$.

Thus, by reducing the charging current level of the maximum permissible charging current within a charge level range and/or a temporal shortening of the charge level range in favor of a charge level range with a lower maximum permissible charging current $I_{charg}$ a corresponding adjustment with an extension of the charging duration can be obtained in the case of full charging. Furthermore, by increasing the charging current level of the maximum permissible charging current within a charge level range and/or a temporal extension of the charge level range at the expense of a charge level range with a lower maximum permissible charging current $I_{charg}$ a corresponding adjustment with a shortening of the charging duration can be obtained in the case of full charging.

In particular, the area under the charging profile curve should remain as unchanged as possible in order to achieve the same charging time durations in the case of full charging. This is achieved, for example, by a reduction in the charging current level of the maximum permissible charging current within a charge level range and a temporal extension of the charge level range at the expense of a charge level range with a lower maximum permissible charging current, and vice versa.

For example, in FIGS. 4a and 4b, a charging profile specified by the manufacturer and an adjusted charging profile determined therefrom which leads to a substantially identical charging time duration during a charging operation are shown by way of example. The original profile of the maximum permissible charging current is shown by a dashed line in FIG. 4b.

In step S5, the corresponding charging profile is assigned to the vehicles 4 of each group and charging operations are carried out in accordance with the usage in daily operation.

In a next step S6, a check is made whether a predetermined time period has elapsed in which a plurality of charging operations have taken place. The predetermined time period can be, for example, between one month and six months, such as one month, three months or six months. If this is the case (alternative: yes), the method will be continued with step S7, otherwise (alternative: no) there will be a jump back to step S1.

After the predetermined time period has elapsed, the respective aging state of each of the vehicle batteries 41 of the selected vehicle batteries is determined in step S7 for each of the vehicles with the aid of a suitable aging state model, for example based on the received operating variable profiles.

In step S8, the aging states at the beginning of the predetermined time period and the aging states at the end of the predetermined time period are averaged in groups or the median is determined, i.e., the aging states of all vehicle batteries 41 of a group are combined to form an average or medianized aging state value. Furthermore, each of the groups is assigned a change in the averaged aging state between the beginning and the end of the predetermined time period as an aging state difference.

In step S9 a check is made next as to whether the aging state differences all fall below a predetermined difference threshold value. If this is the case (alternative: yes), in step S10, the charging profile of the group of vehicle batteries 41 which has led to the lowest aging state difference will be used for all selected vehicle batteries 41. Otherwise (alternative: no), in step S11 an adjusted charging profile will be assigned to the group of vehicle batteries 41 to which the highest aging state difference has been assigned.

The adjustment of the charging profile in step S11 takes place as described above.

Figure 5:
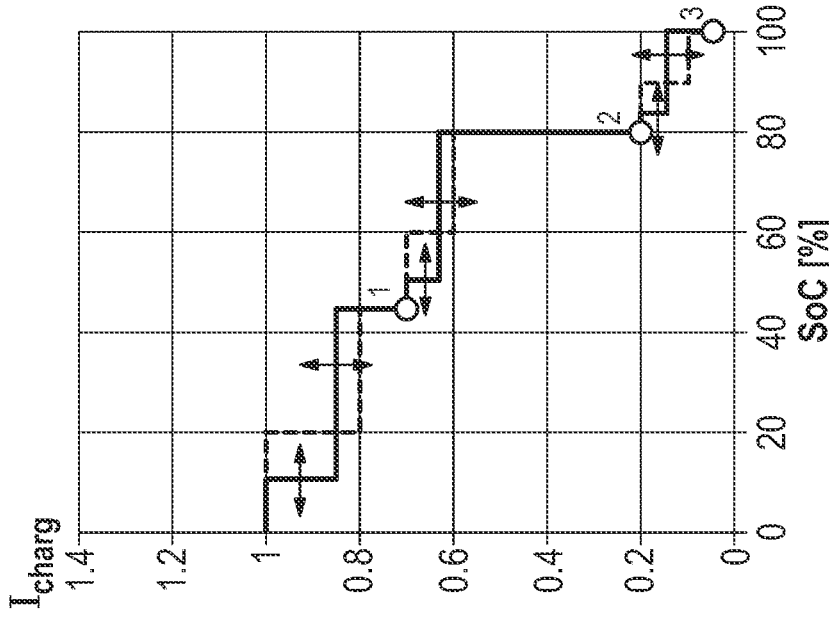
FIG. 5 shows representations of adjustments of exemplary charging profiles.
Figure 5:
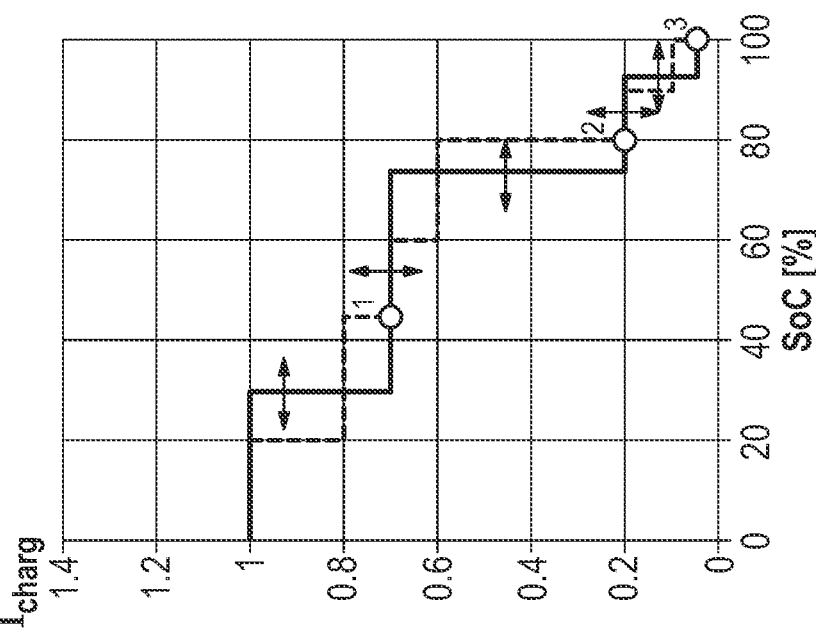

By way of example, in FIG. 5, charging profiles are shown with possibilities for adjusting the charging profile indicated by arrows, wherein mutually variable charging profiles are shown by the solid line and the dashed line.

The adjusted charging profile can be created on the basis of the charging profile of the groups of vehicle batteries 41 to which the lowest aging state difference is assigned, and this selected charging profile can accordingly be made by shortening the charge level range for high maximum permissible charging currents or by reducing the maximum permissible charging current in the charge level range according to a predetermined change factor, e.g. between 0.9 and 0.99.

Figure 6:
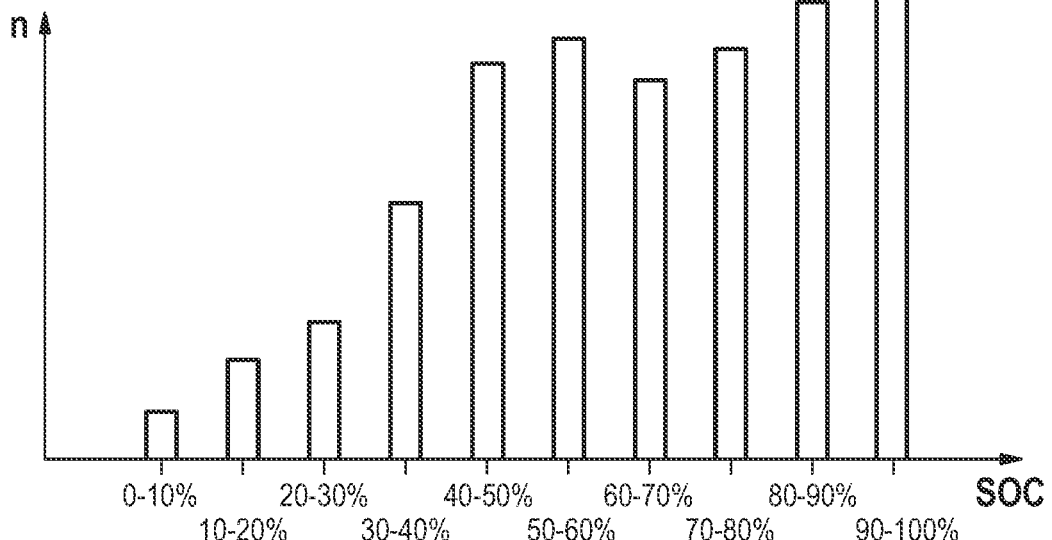
FIG. 6 shows a histogram to illustrate the frequencies of charging vehicle batteries within a certain charge level range.

The change in the course of the adjustment of the charging profile preferably takes place in a range of the charging profile which is preferably passed through during the charging operations of the selected vehicle battery 41. This can be determined, for example, on the basis of a histogram indicating the frequencies of the charge level ranges which are passed through during the charging operations, as is shown, for example, in FIG. 6.

The above method can be carried out for each cluster of selected vehicle batteries 41 and thus provides the best possible charging profile for different vehicle usages. By regularly carrying out the method, the assignment of the vehicle batteries 41 to the clusters can also change, so that a vehicle battery 41 is removed from a cluster and is added to a new cluster with a correspondingly changed usage behavior and benefits from the already learned and adjusted charging profiles of the cluster in question.

The above method is preferably executed in the central unit 2 and the respectively determined charging profile can be transmitted after each adjustment preferably in parametrized form to the respective selected motor vehicles 4 of the vehicle fleet 3.

The invention claimed is:

1. A method for determining charging profiles for device batteries (41) of battery-operated devices (4), the charging profiles determining the execution of respective charging operations of the device batteries, the method comprising:

selecting (S3), via an electronic processor, device batteries (41) having the same usage-related load and the same aging state;

dividing (S4), via the electronic processor, the selected device batteries (41) into groups;

assigning (S5), via the electronic processor, different charging profiles to the groups of device batteries, wherein the charging profiles indicate for a charging operation a maximum permissible charging current depending on a charge level range;

operating (S5), via the electronic processor, the device batteries (41) of all groups with the respectively assigned charging profiles for a predetermined period of time, so that charging operations are executed depending on the respectively assigned charging profile;

detecting (S8), via the electronic processor, a change in the average aging state for each group of device batteries (41) between the beginning of the predetermined time period and the end of the predetermined time period; and adjusting (S10, S11), via the electronic processor, the charging profile of at least one of the groups of the device batteries (41) depending on the change in the average aging state in order to reduce the load on the device batteries (41) of the at least one group.

2. The method according to claim 1, wherein the method iteratively adjusts the charging profile of the at least one group for predetermined time durations in each case until all changes in the average aging states for each group of device batteries (41) are less than a predetermined difference threshold value.

3. The method according to claim 1, wherein the selection of device batteries (41) with the same usage-related load is determined on the basis of operating variable profiles (F), from which one or more operating characteristics are generated.

4. The method according to claim 3, wherein the selection is performed on the basis of histogram data using a clustering method.

5. The method according to claim 1, wherein the charging profile has a stepped profile which in each case assigns a constant maximum permissible charging current ($I_{charg}$) to a charge level range.

6. The method according to claim 5, wherein the adjustment of the charging profile is carried out by (i) reducing or increasing the maximum permissible charging current ($I_{charg}$) within a charge level range, (ii) by extending or shortening the duration of the charge level range in favor of a charge level range with a lower or higher maximum permissible charging current ($I_{charg}$), or both (i) and (ii).

7. The method according to claim 6, wherein the adjustment of the charging profile is carried out within the charge level range that is most frequently run through during charging operations of the selected device batteries.

8. The method according to claim 1, wherein the at least one group of the device batteries (41) is adjusted which has the greatest change in the average aging state.

9. The method according to claim 1, wherein the method is executed in a device-external central unit (2) for each of the device batteries (41) and the adjusted charging profiles are transmitted to the device batteries (41) concerned.

10. A non-transitory, computer-readable medium containing instructions which, when executed by an electronic processor cause the electronic processor to select (S3) device batteries (41) having the same usage-related load and the same aging state;

divide (S4) the selected device batteries (41) into groups;

assign different charging profiles to the groups of device batteries, wherein the charging profiles indicate for a charging operation a maximum permissible charging current depending on a charge level range;

operate the device batteries (41) of all groups with the respectively assigned charging profiles for a predetermined period of time, so that charging operations are executed depending on the respectively assigned charging profile;

detect a change in the average aging state for each group of device batteries (41) between the beginning of the predetermined time period and the end of the predetermined time period; and adjust the charging profile of at least one of the groups of the device batteries (41) depending on the change in the average aging state in order to reduce the load on the device batteries (41) of the at least one group.

\* \* \* \* \*